United States Patent
Mizukami et al.

(10) Patent No.: US 10,734,483 B2
(45) Date of Patent: Aug. 4, 2020

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Makoto Mizukami, Ibo Hyogo (JP); Masaru Furukawa, Himeji Hyogo (JP); Teruyuki Ohashi, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/278,880

(22) Filed: Feb. 19, 2019

(65) Prior Publication Data

US 2020/0091296 A1    Mar. 19, 2020

(30) Foreign Application Priority Data

Sep. 14, 2018  (JP) .................. 2018-173128

(51) Int. Cl.
*H01L 29/15* (2006.01)
*H01L 29/16* (2006.01)
(Continued)

(52) U.S. Cl.
CPC ........ *H01L 29/1608* (2013.01); *H01L 29/045* (2013.01); *H01L 29/0865* (2013.01);
(Continued)

(58) Field of Classification Search
CPC . H01L 29/78; H01L 29/7804; H01L 29/7806; H01L 29/1608; H01L 29/0865; H01L 29/1095; H01L 29/66068
See application file for complete search history.

(56) References Cited

U.S. PATENT DOCUMENTS 7,928,470 B2    4/2011  Yamaguchi et al.
9,214,458 B2    12/2015  Hino et al.
(Continued)

FOREIGN PATENT DOCUMENTS

JP    H01-051664 B2    11/1989
JP         4197400 B2    12/2008
(Continued)

OTHER PUBLICATIONS

Masayuki Furuhashi et al., "Practical applications of SiC-MOSFETs and further developments," Semiconductor Science and Technology 31 (2016), pp. 1-10.

(Continued)

*Primary Examiner* — Phuc T Dang
(74) *Attorney, Agent, or Firm* — White & Case LLP

(57) ABSTRACT

A semiconductor device according to an embodiment includes a silicon carbide layer having first and second planes; a first silicon carbide region; second and third silicon carbide regions between the first silicon carbide region and the first plane; a fourth silicon carbide region between the second silicon carbide region and the first plane; a first and second gate electrodes; a suicide layer on the fourth silicon carbide region; a first electrode on the first plane having a first portion and a second portion, the first portion being in contact with the first silicon carbide region, the second portion being in contact with the suicide layer; a second electrode on the second plane; and an insulating layer between the first portion and the second portion having a first side surface and a second side surface, an angle of the first side surface being smaller than that of the second side surface.

10 Claims, 12 Drawing Sheets

(51) Int. Cl.
*H01L 29/10* (2006.01)
*H01L 29/08* (2006.01)
*H01L 29/66* (2006.01)
*H01L 29/04* (2006.01)
*H01L 29/78* (2006.01)
*H01L 29/51* (2006.01)

(52) U.S. Cl.
CPC ........ *H01L 29/1095* (2013.01); *H01L 29/517* (2013.01); *H01L 29/66068* (2013.01); *H01L 29/7804* (2013.01); *H01L 29/7806* (2013.01)

(56) References Cited

U.S. PATENT DOCUMENTS

| | | | |
|---|---|---|---|
| 9,252,211 | B2 | 2/2016 | Uchida et al. |
| 9,391,190 | B2 | 7/2016 | Watanabe et al. |
| 9,577,073 | B2 | 2/2017 | Esteve et al. |
| 9,691,759 | B2 | 6/2017 | Uchida et al. |
| 9,786,778 | B1 | 10/2017 | Morizuka |
| 9,812,537 | B2 | 11/2017 | Nakano |
| 2013/0062624 | A1* | 3/2013 | Tsuchiya ............. H01L 29/0839 257/77 |
| 2016/0276443 | A1* | 9/2016 | Kono ................. H01L 29/1608 |
| 2017/0033185 | A1* | 2/2017 | Shimizu ............. H01L 29/1608 |
| 2017/0271324 | A1* | 9/2017 | Kumagai ........... H01L 29/0696 |
| 2018/0076294 | A1 | 3/2018 | Nakano |
| 2018/0097103 | A1 | 4/2018 | Sadamatsu et al. |
| 2019/0088774 | A1 | 3/2019 | Mizukami |

FOREIGN PATENT DOCUMENTS

| | | |
|---|---|---|
| JP | 5098300 B2 | 12/2012 |
| JP | 5533104 B2 | 6/2014 |
| JP | 2014-132600 A | 7/2014 |
| JP | 5815882 B2 | 11/2015 |
| JP | 2016-115936 A | 6/2016 |
| JP | 6021032 B2 | 11/2016 |
| JP | 6058228 B1 | 1/2017 |
| JP | 6104743 B2 | 3/2017 |
| JP | 2017-069551 A | 4/2017 |
| JP | 2017-112161 A | 6/2017 |
| JP | 6143490 B2 | 6/2017 |
| JP | 2017-216297 A | 12/2017 |
| JP | 2019-57573 A | 4/2019 |
| WO | 2016042621 A1 | 3/2016 |

OTHER PUBLICATIONS

Yusuke Kobayashi et al., "Body PiN diode inactivation with low on-resistance achieved by a 1.2 kV-class 4H—SiC SWITCH-MOS," IEDM17-211-214, IEEE 2017.

S. Harada, "1200 V SIC IE-UMOSFET with Low On-Resistance and High Threshold Voltage," Materials Science Forum vol. 897, Silicon Carbide and Related Materials, 2016, pp. 497-500.

Yusuke Kobayashi et al., "Low on-rsistance SiC trench MOSFET with suppressed short channel effect by halo implantation," ICSCRM 2017, pp. 1-3.

Dethard Peters et al., "Performance and Ruggedness of 1200V SiC-Trench-MOSFET," Proceedings of the 29th International Symposium on Power Semiconductor Devices & ICs, 2017, pp. 239-242.

Aiko Ichimura et al., "4H—SiC Trench MOSFET with Ultra-Low On-Resistance by Using Miniaturization Technology," Materials Science Forum vol. 924, Silicon Carbide and Related Materials, 2017, pp. 707-710.

Shinya Kyogoku et al., "Role of Trench Bottom Shielding Region on Switching Characteristics of 4H—SiC Double-Trench MOSFETs," Material Science Forum vol. 924, Silicon Carbide and Related Materials, 2017, pp. 748-751.

* cited by examiner

SEMICONDUCTOR DEVICE

CROSS-REFERENCE TO RELATED APPLICATION

This application is based upon and claims the benefit of priority from Japanese Patent Application No. 2018-173128, filed on Sep. 14, 2018, the entire contents of which are incorporated herein by reference.

FIELD

Embodiments described herein relate generally to a semiconductor device.

BACKGROUND

A silicon carbide is expected as a material for next generation semiconductor devices. In comparison with silicon, the silicon carbide has superior physical properties such as a band gap of about 3 times, a breakdown field strength of about 10 times, and a thermal conductivity of about 3 times. By utilizing these characteristics, for example, it is possible to realize a metal oxide semiconductor field effect transistor (MOSFET) which can operate at a high breakdown voltage, a low loss, and a high temperature.

A vertical type MOSFET using silicon carbide has a pn junction diode as a parasitic built-in diode. For example, the MOSFET is used as a switching element connected to an inductive load. In this case, even when the MOSFET is turned off, by using a pn junction diode, it is possible to allow a reflux current to flow.

However, when a reflux current is allowed to flow by using a pn junction diode, stacking faults grow in the silicon carbide layer due to the recombination energy of carriers, and thus, there is a concern that the on-resistance of the MOSFET may increase. An increase in the on-resistance of the MOSFET causes degradation in the reliability of the MOSFET.

DETAILED DESCRIPTION

Figure 1:
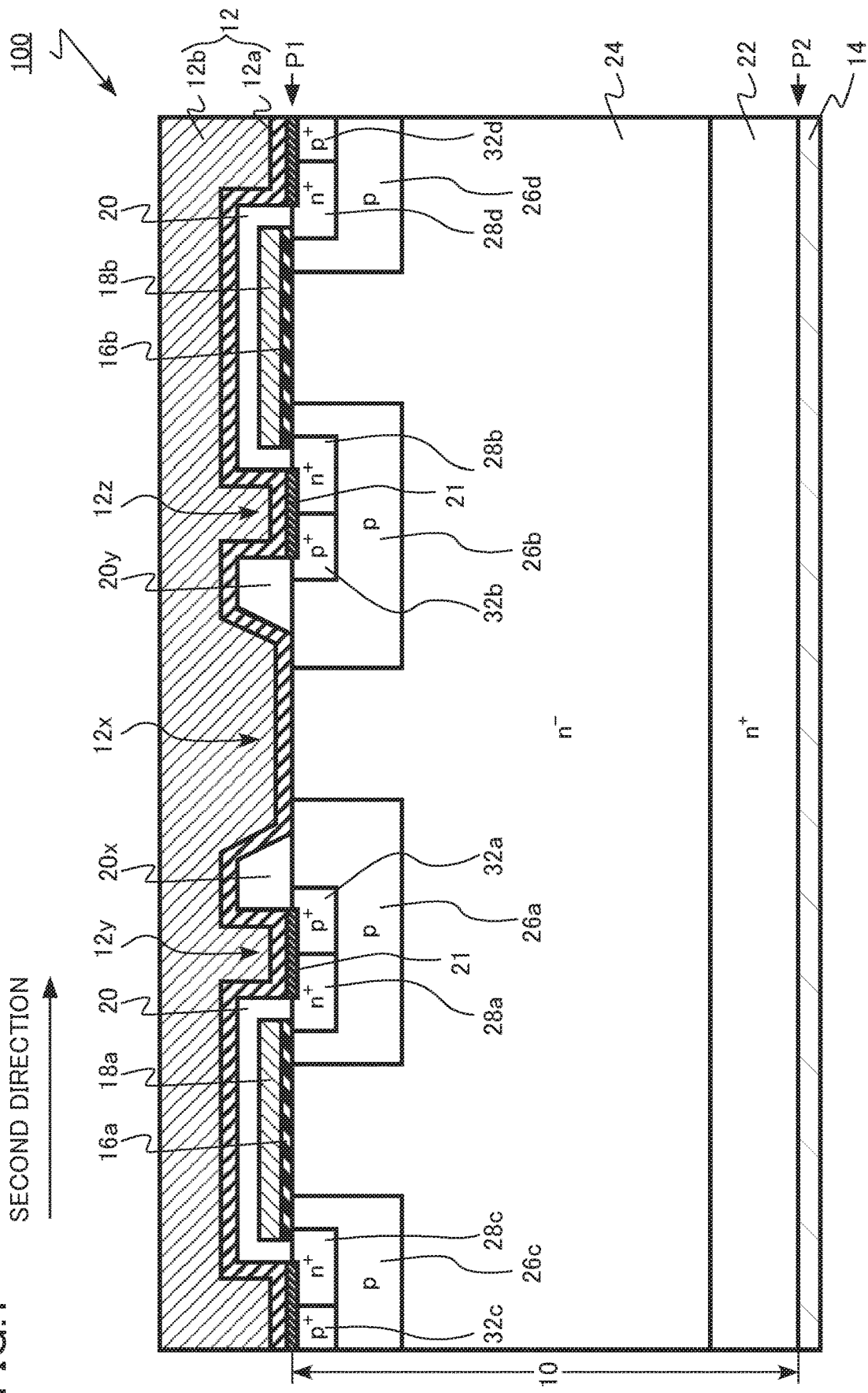
FIG. 1 is a schematic cross-sectional view of a semiconductor device according to an embodiment.

Hereinafter, embodiments of the invention will be described with reference to the drawings. In addition, the following description, the same or similar members or the like are denoted by the same reference numerals, and the description of the members or the like once described may be omitted as appropriate.

In addition, in the following description, the notations $n^+$, n, $n^-$, $p^+$, p, and $p^-$ indicate relative magnitude of impurity concentration in respective conductivity types. That is, n indicates that the n-type impurity concentration is relatively higher than that of n, and $n^-$ indicates that the n-type impurity concentration is relatively lower than that of n. In addition, $p^+$ indicates that the p-type impurity concentration is relatively higher than that of p, and $p^-$ indicates that the p-type impurity concentration is relatively lower than that of p. In addition, sometimes, the $n^+$-type and the $n^-$-type may be simply described as n-type, and the $p^+$-type and the $p^-$-type may be simply described as the p-type.

The impurity concentration can be measured by, for example, secondary ion mass spectrometry (SIMS). In addition, a relative magnitude of an impurity concentration may also be determined from a magnitude of a carrier concentration obtained by, for example, scanning capacitance microscope (SCM). In addition, a distance such as a depth and a thickness of an impurity region can be obtained by, for example, SIMS. In addition, the distance such as a depth, a thickness, a width, and an interval of an impurity region can be obtained by using, for example, an SCM image and a measurement result of the SIMS. In addition, the shapes and the like of the insulating layers can be determined by, for example, scanning electron microscope (SEM) or transmission electron microscope (TEM).

A semiconductor device according to an embodiment includes: a silicon carbide layer having a first plane and a second plane opposite to the first plane; a first silicon carbide region of a first conductivity type in the silicon carbide layer; a second silicon carbide region of a second conductivity type provided between the first silicon carbide region and the first plane; a third silicon carbide region of the second conductivity type provided between the first silicon carbide region and the first plane; a fourth silicon carbide region of the first conductivity type provided between the second silicon carbide region and the first plane; a first gate electrode provided on a side of the first plane of the silicon carbide layer; a second gate electrode provided on a side of the first plane of the silicon carbide layer; a first gate insulating layer provided between the first gate electrode and the second silicon carbide region; a second gate insulating layer provided between the second gate electrode and the third silicon carbide region; a silicide layer provided on the fourth silicon carbide region; a first electrode provided on a side of the first plane of the silicon carbide layer, having a first portion located between the first gate electrode and the second gate electrode and a second portion located between the first portion and the first gate electrode, the first portion being in contact with the first silicon carbide region between the second silicon carbide region and the third silicon carbide region, and the second portion being in contact with the silicide layer; a second electrode provided on a side of the second plane of the silicon carbide layer; and an insulating layer provided between the first portion and the second portion, having a first side surface on a first portion side and a second side surface on a second portion side, a first angle between the first side surface and the first plane being smaller than a second angle between the second side surface and the first plane.

Figure 2:
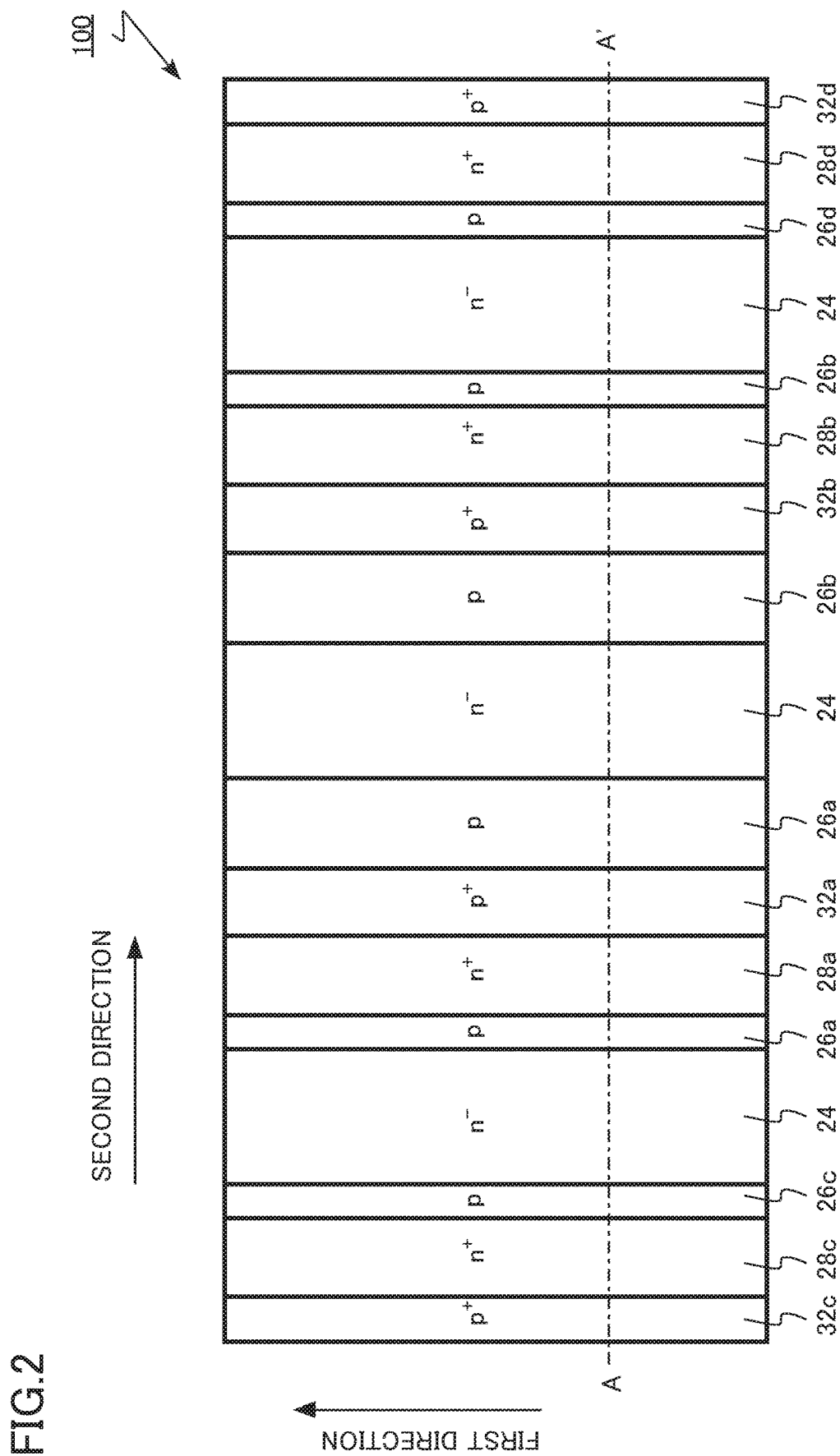
FIG. 2 is a schematic top view of the semiconductor device according to the embodiment.
Figure 3:
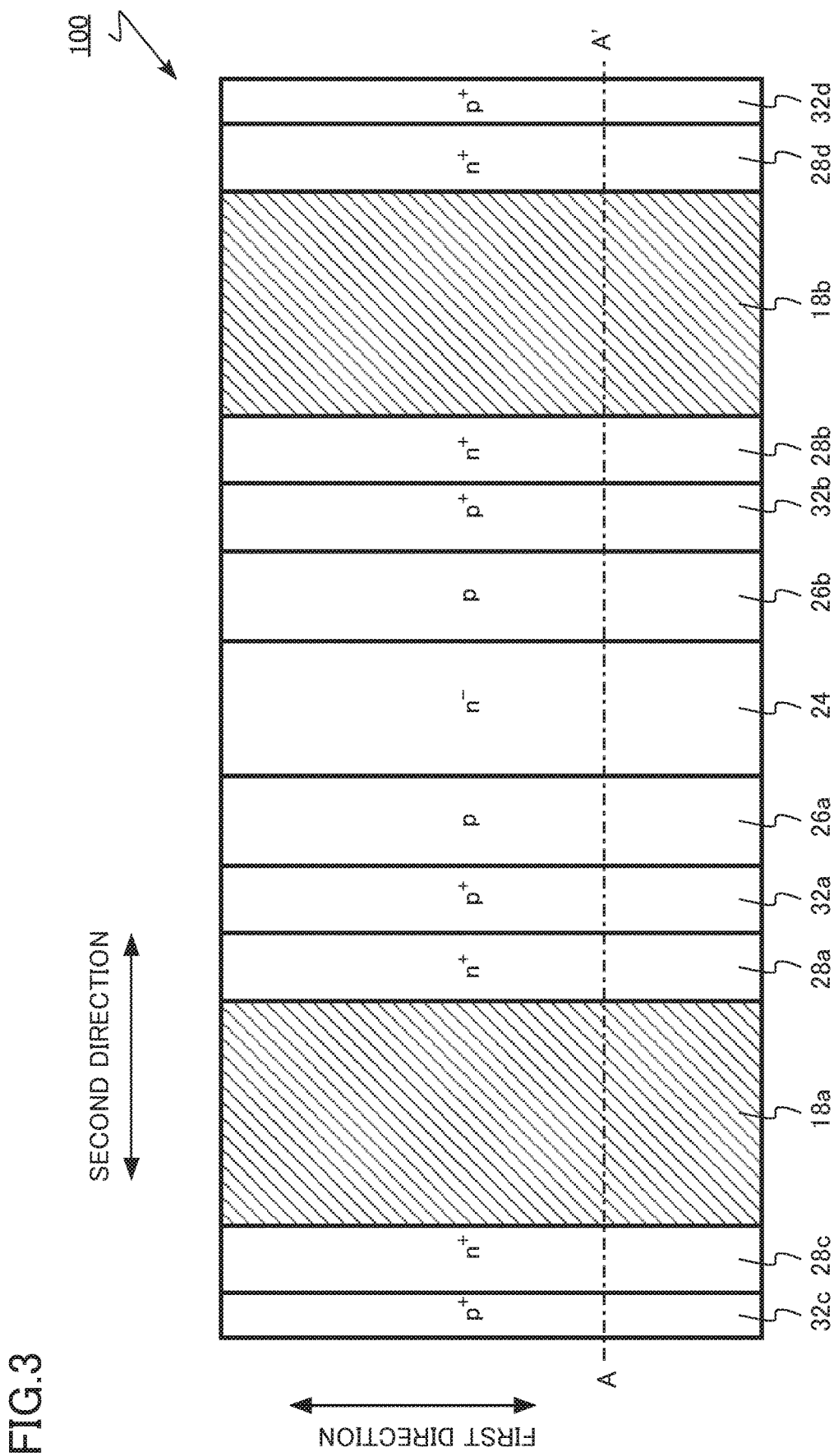
FIG. 3 is a schematic top view of the semiconductor device according to the embodiment.

FIG. 1 is a schematic cross-sectional view of the semiconductor device according to the embodiment. FIGS. 2 and 3 are schematic top views of the semiconductor device according to the embodiment. FIG. 2 is a view illustrating a pattern of the silicon carbide region on the front surface of the silicon carbide layer. FIG. 3 is a view in which a pattern of the gate electrode is superimposed on FIG. 2. FIG. 1 is a cross-sectional view taken along line A-A' of FIGS. 2 and 3.

The semiconductor device according to the embodiment is a planar gate type vertical MOSFET 100 using silicon carbide. The MOSFET 100 according to the embodiment is, for example, a double implantation MOSFET (DIMOSFET) in which a body region and a source region are formed by ion implantation. In addition, the semiconductor device according to the embodiment includes a Schottky barrier diode (SBD) as a built-in diode.

Hereinafter, a case where the first conductivity type is n-type and the second conductivity type is p-type will be described as an example. The MOSFET 100 is a vertical type n-channel MOSFET using electrons as carriers.

The MOSFET 100 includes a silicon carbide layer 10, a source electrode 12 (first electrode), a drain electrode 14 (second electrode), a first gate insulating layer 16a, a second gate insulating layer 16b, a first gate electrode 18a, a second gate electrode 18b an interlayer insulating layer 20, and a silicide layer 21. The source electrode 12 includes a barrier metal layer 12a (first layer), a main metal layer 12b (second layer), a Schottky portion 12x (first portion), a first contact portion 12y (second portion), and a second contact portion 12z. The interlayer insulating layer 20 has a first buffer region 20x (insulating layer) and a second buffer region 20y.

In the silicon carbide layer 10, an n$^+$-type drain region 22, an n$^-$-type drift region 24 (first silicon carbide region), a p-type first body region 26a (second silicon carbide region), a p-type second body region 26b (third silicon carbide region), a p-type third body region 26c, a p-type fourth body region 26d, an n$^+$-type first source region 28a (fourth silicon carbide region), an n$^+$-type second source region 28b, n$^+$-type third source region 28c, an n$^+$-type fourth source region 28d, a p$^+$-type first body contact, region 32a, a p$^+$-type second body contact region 32b, a p$^+$-type third body contact region 32c, a p$^+$-type fourth body contact region 32d are provided.

The silicon carbide layer 10 is provided between the source electrode 12 and the drain electrode 14. The silicon carbide layer 10 as single crystal SiC. The silicon carbide layer 10 is, for example, 4H—SiC.

The silicon carbide layer 10 has a first plane ("P1" in FIG. 1) and a second plane ("P2" in FIG. 1). In addition, hereinafter, the "depth" denotes the depth based on the first plane P1.

For example, the first plane P1 is a plane inclined at 0 degrees or more and 8 degrees or less with respect to the (0001) plane. In addition, for example, the second plane 92 is a plane inclined at 0 degrees or more 8 degrees or less with respect to the (000-1) plane. The (0001) plane is called a silicon plane. The (000-1) plane is called a carbon plane.

The n$^+$-type drain region 22 is provided on a side of the second plane P2 in the silicon carbide layer 10. The drain region 22 contains, for example, nitrogen (N) as n-type impurities. The n-type impurity concentration of the drain region 22 as, for example, $1 \times 10^{18}$ cm$^{-3}$ or more and $1 \times 10^{21}$ cm$^{-3}$ or less.

The n-type drift region 24 is provided between the drain region 22 and the first plane P1. The n$^-$-type drift region 24 is provided between the source electrode 12 and the drain electrode 14.

The n$^-$-type drift region 24 is provided on the drain region 22. The drift region 24 contains, for example, nitrogen (N) as n-type impurities. The n-type impurity concentration of the drift region 24 is lower than the n-type impurity concentration of the drain region 22. The n-type impurity concentration of the drift region 24 is, for example, $4 \times 10^{14}$ cm$^{-3}$ or more and $1 \times 10^{-3}$ cm or less. The thickness of the drift region 24 is, for example, 4 µm or more and 150 µm or less.

The p-type first body region 26a, the second body region 26b, the third body region 26c, and the fourth body region 26d are provided between the drift region 24 and the first plane P1. The first body region 26a, the second body region 26b, the third body region 26c, and the fourth body region 26d are separated from each other. The first body region 26a, the second body region 26b, the third body region 26c, and the fourth body region 26d function as a channel region of the MOSFET 100.

The first body region 26a, the second body region 26b, the third body region 26c, and the fourth body region 26d contain, for example, aluminum (Al) as p-type impurities. The p-type impurity concentrations of the first body region 26a, the second body region 26b, the third body region 26c, and the fourth body region 26d are, for example, $1 \times 10^{17}$ cm$^{-3}$ or more and $5 \times 10^{18}$ cm$^{-3}$ or less.

The depths of the first body region 26a, the second body region 26b, the third body region 26c, and the fourth body region 26d are, for example, 0.3 µm or more and 0.8 µm or less.

The first body region 26a, the second body region 26b, the third body region 26c, and the fourth body region 26d are fixed to the potential of the source electrode 12.

The n$^+$-type first source region 28a is provided between the first body region 26a and the first plane P1. The n$^+$-type second source region 28b is provided between the second body region 26b and the first plane P1. The n$^+$-type third source region 28c is provided between the third body region 26c and the first plane P1. The n$^+$-type fourth source region 28d is provided between the fourth body region 26d and the first plane P1.

The first source region 28a, the second source region 28b, the third source region 28c, and the fourth source region 28d contain, for example, phosphorus (P) as n-type impurities. The n-type impurity concentrations of the first source region 28a, the second source region 28b, the third source region 28c, and the fourth source region 28d are higher than the n-type impurity concentration of the drift region 24.

The n-type impurity concentrations of the first source region 28a, the second source region 28b, the third source region 28c, and the fourth source region 28d are, for example, $5 \times 10^{18}$ cm$^{-3}$ or more and $1 \times 10^{21}$ cm$^{-3}$ or less. The depths of the first source region 28a, the second source region 28b, the third source region 28c, and the fourth source region 28d are smaller than the depths of the first body region 26a, the second body region 26b, the third body region 26c and the fourth body region 26d and are, for example, 0.1 µm or more and 0.3 µm or less.

The first source region 28a, the second source region 28b, the third source region 28c, and the fourth source region 28d are electrically connected to the source electrode 12. The first source region 28a, the second source region 28b, the third source region 28c, and the fourth source region 28d are fixed to the potential of the source electrode 12.

The p+-type first body contact region 32a is provided between the first body region 26a and the first plane P1. The p+-type second body contact region 32b is provided between the second body region 26b and the first plane P1. The p+-type third body contact region 32c is provided between the third body region 26c and the first plane P1. The p+-type fourth body contact region 32d is provided between the fourth body region 26d and the first plane P1.

The impurity concentrations of p-type impurities in the first body contact region 32a, the second body contact region 32b, the third body contact region 32c, and the fourth body contact region 32d are higher than the impurity concentrations of p-type impurities in the first body region 26a, the second body region 26b, the third body region 26c, and the fourth body region 26d.

The first body contact region 32a, the second body contact region 32b, the third body contact region 32c, and the fourth body contact region 32d contain, for example, aluminum (Al) as p-type impurities. The p-type impurity concentration of the first body contact region 32a, the second body contact region 32b, the third body contact region 32c, and the fourth body contact region 32d is, for example, $5 \times 10^{18}$ cm$^{-3}$ or more and $1 \times 10^{21}$ cm$^{-3}$ or less.

The depths of the first body contact region 32a, the second body contact region 32b, the third body contact region 32c, and the fourth body contact region 32d are, for example, 0.3 µm or more and 0.6 µm or less.

The first body contact region 32a, the second body contact region 32b, the third body contact region 32c, and the fourth body contact region 32d are electrically connected to the source electrode 12. The first body contact region 32a, the second body contact region 32b, the third body contact region 32c, and the fourth body contact region 32d are fixed to the potential of the source electrode 12.

The silicide layer 21 is provided on the first source region 28a, the second source region 28b, the third source region 28c, and the fourth source region 28d. The silicide layer 21 is provided on the first body contact region 32a, the second body contact region 32b, the third body contact region 32c, and the fourth body contact region 32d.

The silicide layer 21 is, for example, nickel silicide, titanium silicide, molybdenum silicide, or tungsten silicide.

The first gate electrode 18a is provided on the first plane P1 side of the silicon carbide layer 10. The first gate electrode 18a extends in the first direction.

The second gate electrode 18b is provided on the first plane P1 side of the silicon carbide layer 10. The second gate electrode 18b extends in the first direction. The second gate electrode 18b is arranged parallel with the first gate electrode 18a in the second direction orthogonal to the first direction.

The first gate electrode 18a and the second gate electrode 18b are conductive layers. The first gate electrode 18a and the second gate electrode 18b are, for example, polycrystalline silicon containing p-type impurities or n-type impurities.

The first gate insulating layer 16a is provided between the first gate electrode 18a and each of the first body region 26a and the third body region 26c. The first gate insulating layer 16a is provided between the first gate electrode 18a and the drift region 24 located between the first body region 26a and the third body region 26c.

The second gate insulating layer 16b is provided between the second gate electrode 18b and each of the second body region 26b and the fourth body region 26d. The second gate insulating layer 16b is provided between the second gate electrode 18b and the drift region 24 located between the second body region 26b and the fourth body region 26d.

The first gate insulating layer 16a and the second gate insulating layer 16b are, for example, a silicon oxide. For example, a high-k insulating material (high electric constant insulating material) can be applied to the gate insulating layer 16. For example, a silicon oxide subjected to nitriding treatment can be applied to the gate insulating layer 16.

The regions of the first body region 26a and the third body region 26c that face the first gate electrode 18a function as channel regions of the MOSFET 100. The regions of the second body region 26b and the fourth body region 26d that face the second gate electrode 18b function as channel regions of the MOSFET 100.

The source electrode 12 is provided on a side of the first plane P1 of the silicon carbide layer 10. The source electrode 12 has, for example, a stacked structure of a barrier metal layer 12a and a main metal layer 12b. The source electrode 12 contains a metal.

The barrier metal layer 12a contains, for example, titanium (Ti). The barrier metal layer 12a is, for example, titanium or a titanium nitride. The barrier metal layer 12a is, for example, titanium and a titanium nitride.

The main metal layer 12b contains, for example, aluminum (Al). The main metal layer 12b is, for example, aluminum or an aluminum alloy.

The source electrode 12 has a Schottky portion 12x, a first contact portion 12y, and a second contact portion 12z. The Schottky portion 12x, the first contact portion 12y, and the second contact portion 12z are located between the first gate electrode 18a and the second gate electrode 18b.

The first contact portion 12y is located between the Schottky portion 12x and the first to electrode 18a. The second contact portion 12z is located between the Schottky portion 12x and the second gate electrode 18b.

The Schottky portion 12x is in contact with the drift region 24 located between the first body region 26a and the second body region 26b. The junction between the Schottky portion 12x and the drift region 24 is Schottky junction.

The Schottky portion 12x is in contact with the first body region 26a. In addition, the Schottky portion 12x is in contact with the second body region 26b. The end portion of the Schottky portion 12x in contact with the first plane P1 is located on the first body region 26a and the second body region 26b. The corner portion of the Schotty portion 12x on the first plane P1 side is in contact with the first body region 26a and the second body region 26b.

The width of the portion where the Schottky portion 12x is in contact with the first body region 26a in the second direction is, for example, larger than one third of the thickness of the barrier metal layer 12a. The width of the portion where the Schottky portion 12x is in contact with the second body region 26b in the second direction is, for example, larger than one third of the thickness of the barrier metal layer 12a.

The first contact portion 12y and the second contact portion 12z are in contact with the silicide layer 21. The silicide layer 21, the first contact portion 12y and the second contact portion 12z are at the same potential. The contact between the silicide layer 21 and each of the first source region 28a and the first body contact region 32a is, for example, ohmic contact. In addition, the contact between the silicide layer 21 and each of the second source region 28b and the second body contact region 32b is, for example, ohmic contact.

The drain electrode 14 is provided on a side of the second plane P2 of the silicon carbide layer 10. The drain electrode 14 is in contact with the drain region 22.

The drain electrode 14 is, for example, a metal or a metal semiconductor compound. For example, the drain electrode 14 contains at least one material selected from the croup consisting of nickel silicide, titanium (Ti), nickel (Ni) silver (Ag), and gold (Au).

The interlayer insulating layer 20 is provided between the source electrode 12 and the silicon carbide layer 10. The interlayer insulating layer 20 is, for example, a silicon oxide.

The interlayer insulating layer 20 has a first buffer region 20x (insulating layer) and a second buffer region 20y. The first buffer region 20x is provided between the Schottky portion 12x and the first contact portion 12y. The second buffer region 20y is provided between the Schottky portion 12x and the second contact portion 12z.

Figure 4:
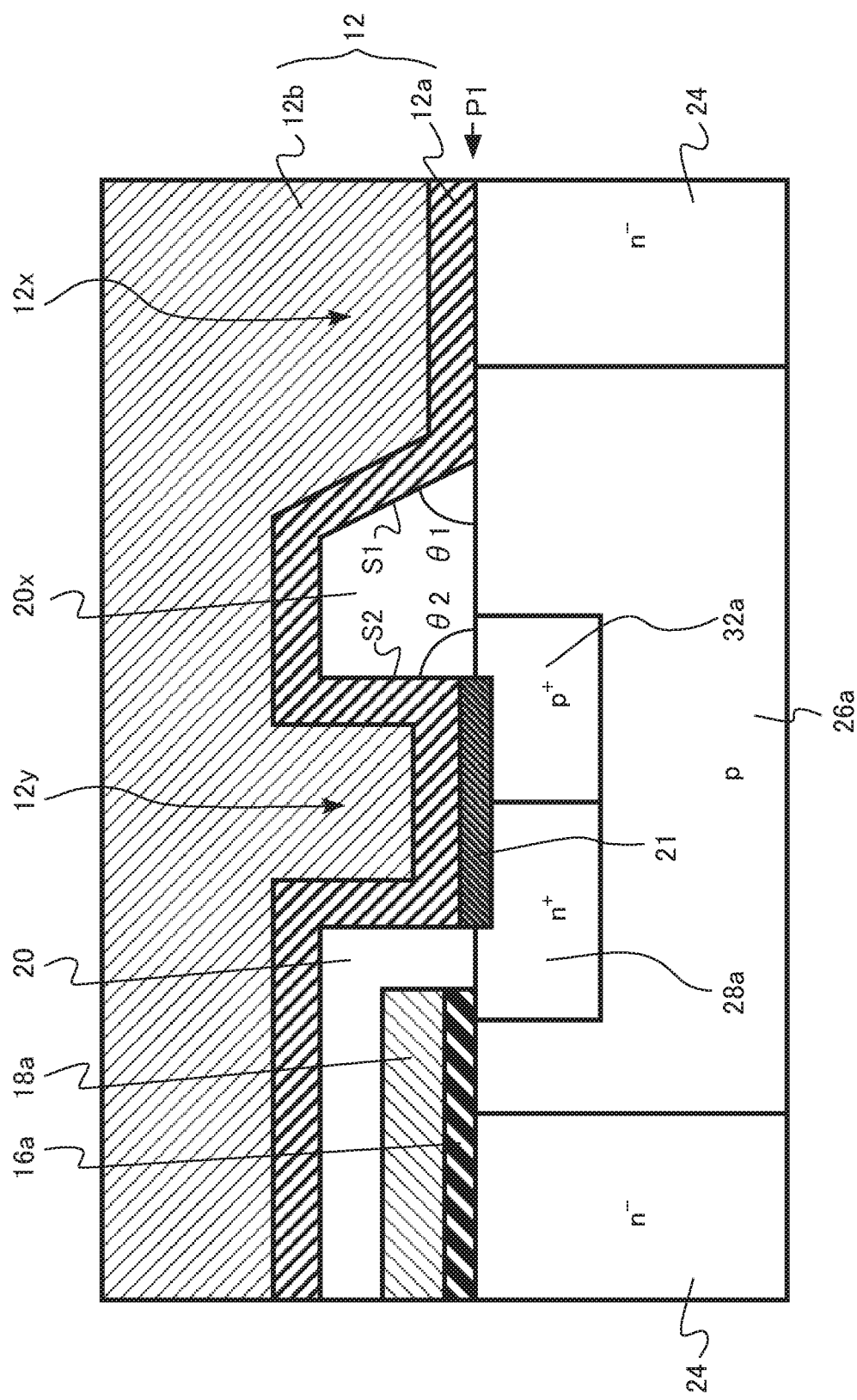
FIG. 4 is a partially enlarged schematic cross-sectional view of the semiconductor device according to the embodiment.

FIG. 4 is a partially enlarged schematic cross-sectional view of the semiconductor device according to the embodiment. FIG. 4 is a cross-sectional view including the first buffer region 20x.

The first buffer region 20x has a first side surface S1 on the Schottky portion 12x side and a second side surface S2 on the first contact portion 12y side. The first side surface S1 and the second side surface S2 are in contact with the barrier metal layer 12a. The first buffer region 20x is in contact with the first plane P1.

The angle between the first side surface S1 and the first plane P1 is the first angle θ1. The angle between the second side surface S2 and the first plane P1 is the second angle θ2. The first angle θ1 is smaller than the second angle θ2.

The first buffer region 20x has a right-left asymmetric shape. The first side surface S1 of the first buffer region 20x has a tapered shape.

The first angle θ1 is, for example, 70 degrees or less. The second angle θ2 is, for example, 80 degrees or more.

The end portion of the first buffer region 20x on the Schottky portion 12x side is located on the first body region 26a.

Similarly to the first buffer region 20x, the second buffer region 20y has a first side surface on the Schottky portion 12x side and a second side surface on the second contact portion 12z side. The first side surface and the second side surface are in contact with the barrier metal layer 12a. The second buffer region 20y is in contact with the first plane P1.

The angle between the first side surface of the second buffer region 20y and the first plane P1 is the first angle. The angle between the second side surface and the first plane P1 is the second angle. The first angle is smaller than the second angle.

The second buffer region 20y has a right-left asymmetric shape. The first side surface of the second buffer region 20y has a tapered shape.

The first angle of the second buffer region 20y is, for 70 degrees or less. The second angle is, for example, 80 degrees or more.

The end portion of the second buffer region 20y on the Schottky portion 12x side is located on the second body region 26b.

Next, an example of the method of manufacturing the semiconductor device according to the embodiment will be described. FIGS. 5, 6, 7, 8, 9, and 10 are schematic cross-sectional views in the process of manufacturing the semiconductor device according to the embodiment.

First, the silicon carbide layer 10 is prepared. The silicon carbide layer 10 has a first plane ("P1" in FIG. 1) and a second plane ("P2" in FIG. 1).

The silicon carbide layer 10 has the $n^+$-type drain region 22 and the $n^+$-type drift region 24. The drift region 24 is formed, for example, on the drain region 22 by an epitaxial growth method.

Figure 5:
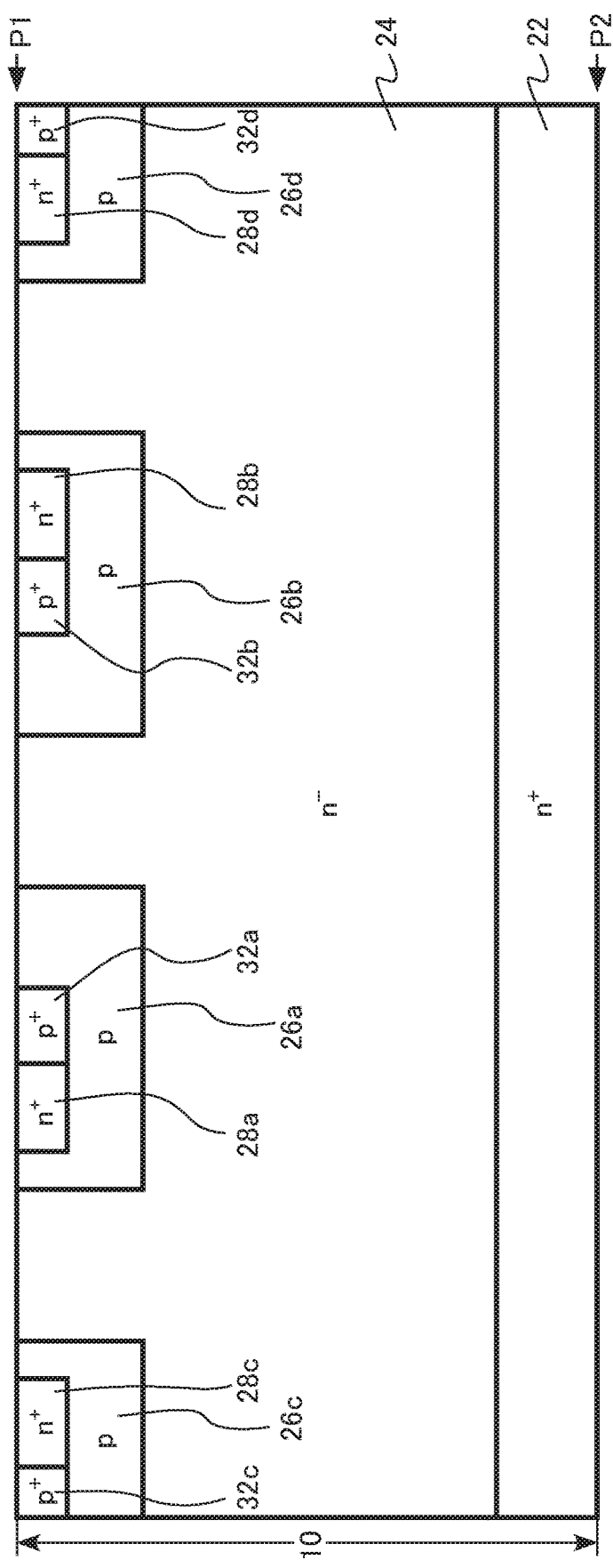
FIG. 5 is a schematic cross-sectional view in the process of manufacturing the semiconductor device according to the embodiment.

Next, by using the lithography method and the ion implantation method, the p-type first body region 26a, the p-type second body region 26b, the p-type third body region 26c, the p-type fourth body region 26d, the $n^+$-type first source region 28a, the $n^+$-type second source region 28b, the $n^+$-type third source region 28c, the $n^+$-type fourth source region 28d, the $p^+$-type first body contact region 32a, the $p^+$-type second body contact region 32b, the $p^+$-type third body contact region 32c, and the $p^+$-type fourth body contact region 32d are formed in the silicon carbide layer 10 (FIG. 5).

Figure 6:
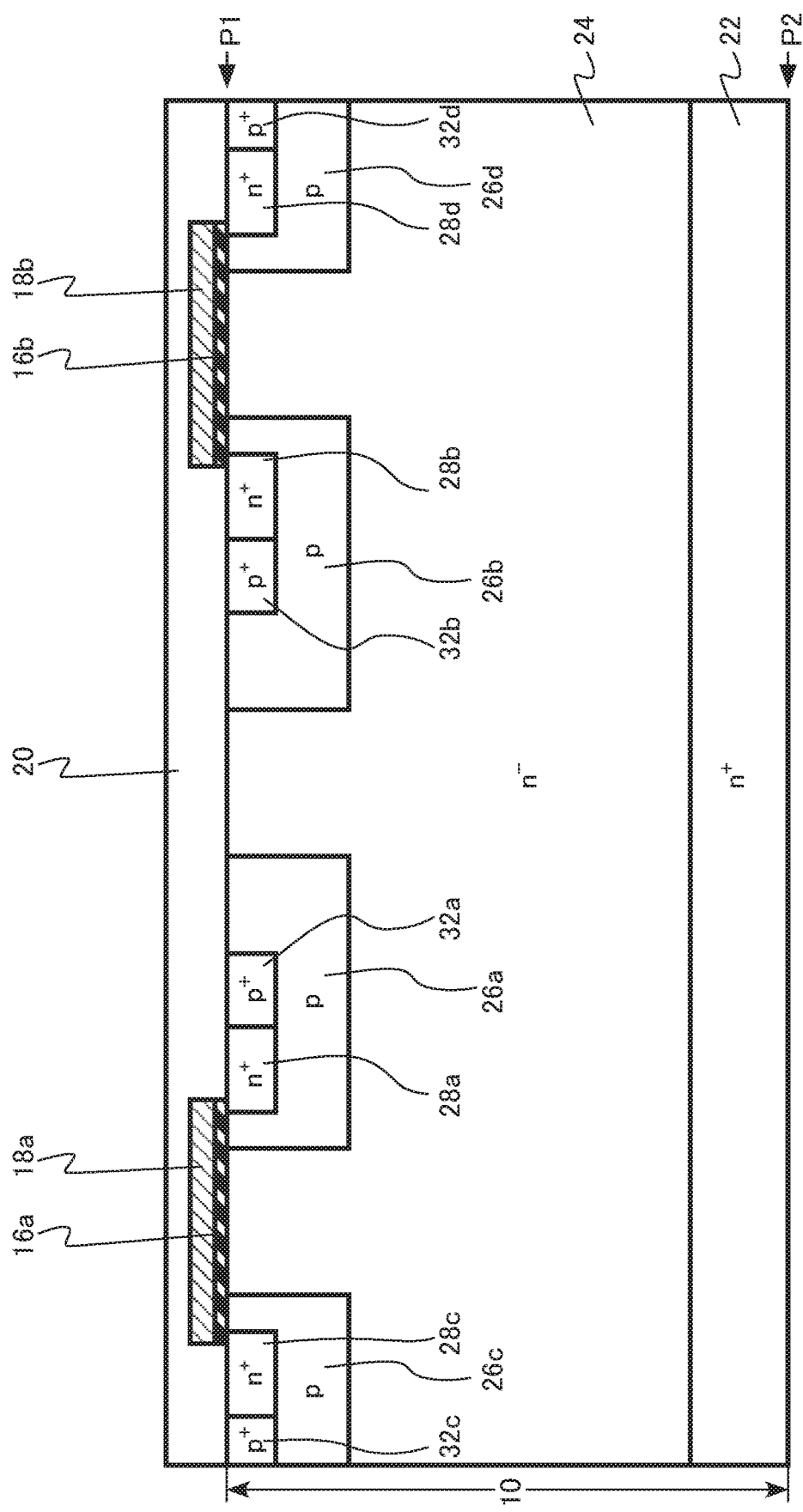
FIG. 6 is a schematic cross-sectional view in the process of manufacturing the semiconductor device according to the embodiment.

Next, by a known process technique, a first gate insulating layer 16a, a second gate insulating layer 16b, a first gate electrode 18a, a second gate electrode 18b, and interlayer insulating layer 20 are formed on the first plane 91 of the silicon carbide layer 10 (FIG. 6).

Figure 7:
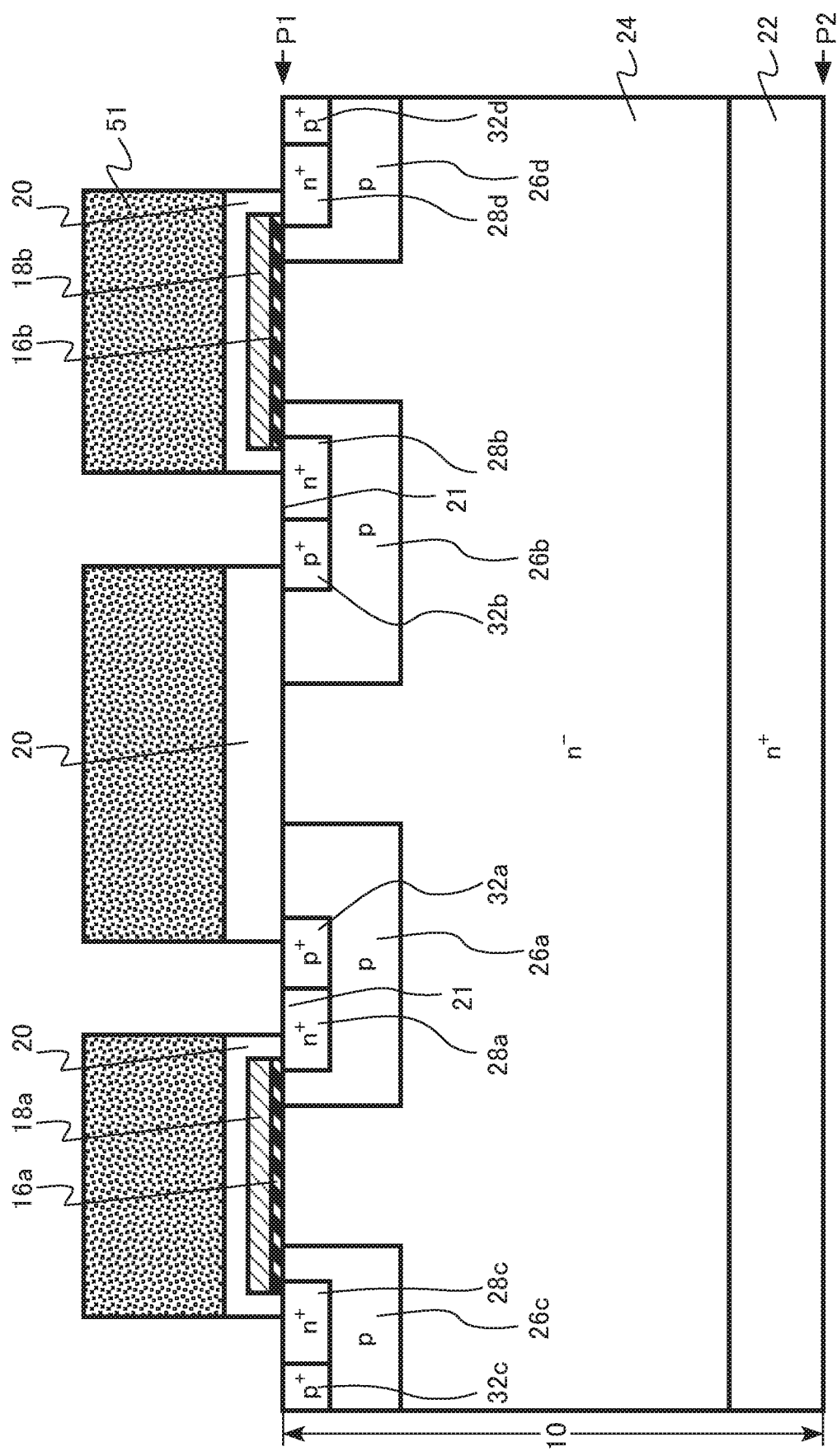
FIG. 7 is a schematic cross-sectional view in the process of manufacturing the semiconductor device according to the embodiment.

Next, a first resist mask 51 is formed on the interlayer insulating layer 20. Next, anisotropic dry etching is performed by using the first resist mask 51 as a mask to form a first opening so that the $n^+$-type first source region 28a, the $n^+$-type second source region 28b, the $n^+$-type third source region 28c, the $n^+$-type fourth source region 28d, the $p^+$-type first body contact region 32a, the $p^+$-type second body contact region 32b, the $p^+$-type third body contact region 32c, and the $p^+$-type fourth body contact region 32d are exposed (FIG. 7). The anisotropic dry etching is, for example, reactive ion etching.

Figure 8:
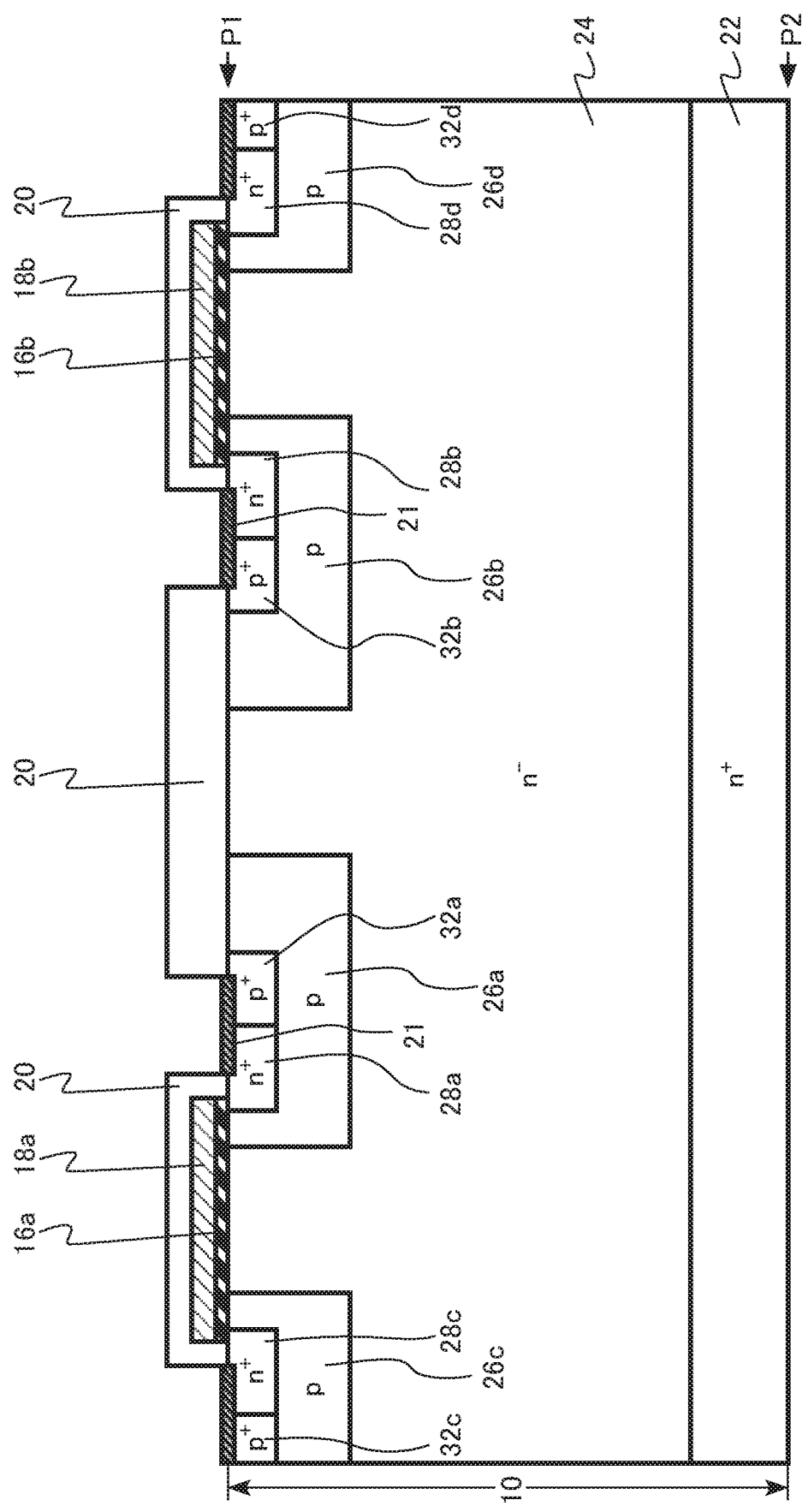
FIG. 8 is a schematic cross-sectional view in the process of manufacturing the semiconductor device according to the embodiment.

Next, the first resist mask 51 is removed. Next, the suicide layer 21 is formed on the first source region 28a, the second source region 28b, the third source region 28c, the fourth source region 28d, the first body contact region 32a, the second body contact region 32b, the third body contact region 32c, and the fourth body contact region 32d that are exposed to the first opening of the interlayer insulating layer 20 (FIG. 8). The suicide layer 21 is formed, for example, by deposition of a metal film, silicidation by heat treatment, and removing of an unreacted metal film.

Figure 9:
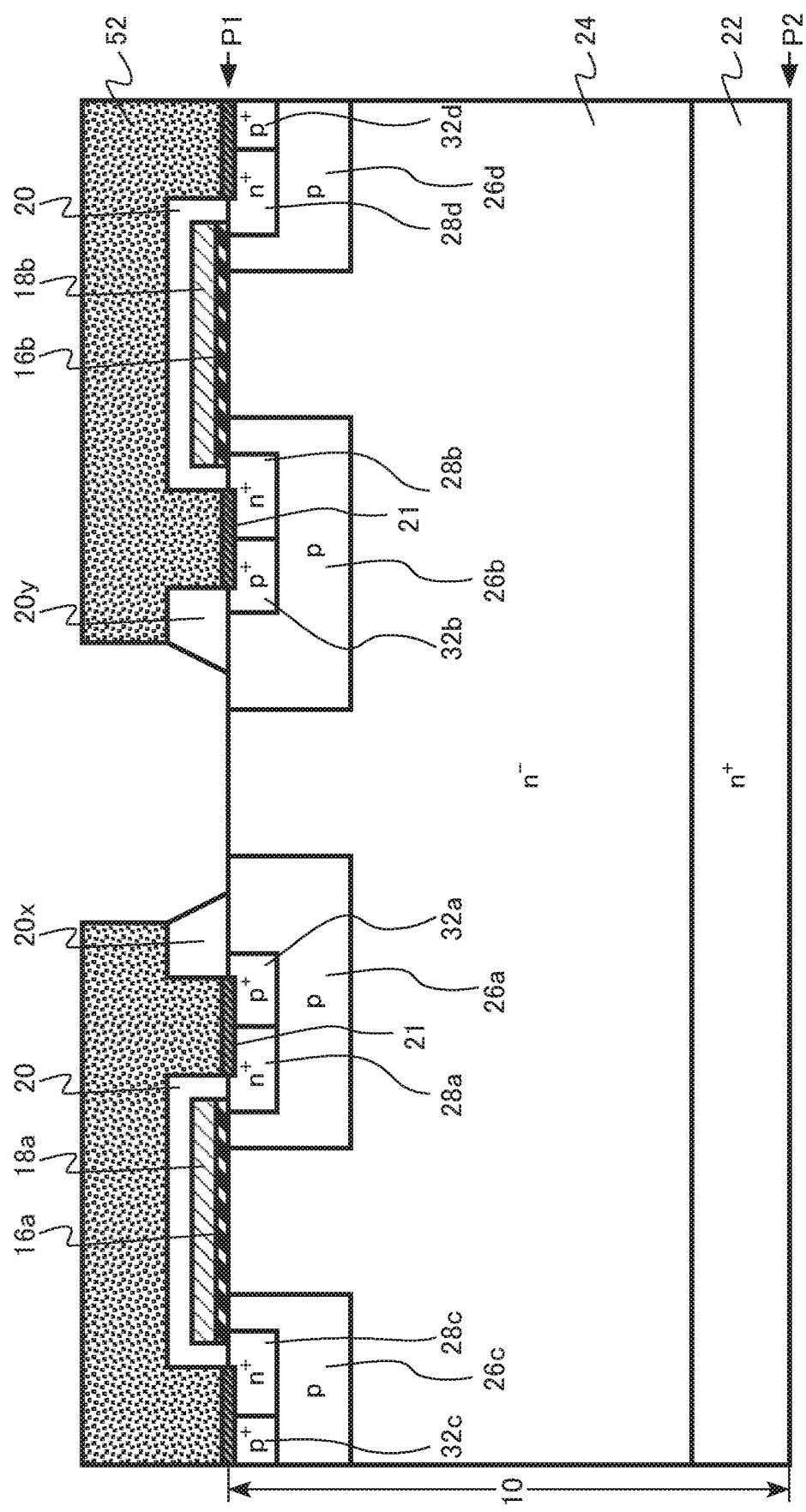
FIG. 9 is a schematic cross-sectional view in the process of manufacturing the semiconductor device according to the embodiment.

Next, a second resist mask 52 is formed on the interlayer insulating layer 20 and the silicide layer 21. Next, wet etching is performed by using the second resist mask 52 as a mask to form a second opening so that the drift region 24 is exposed (FIG. 9). At this time, the first buffer region 20x and the second buffer region 20y are formed.

By opening the second opening by wet etching, the side surfaces of the first buffer region 20x and the second buffer region 20y become tapered. Incidentally, instead of the wet etching, for example, isotropic dry etching may be performed.

Figure 10:
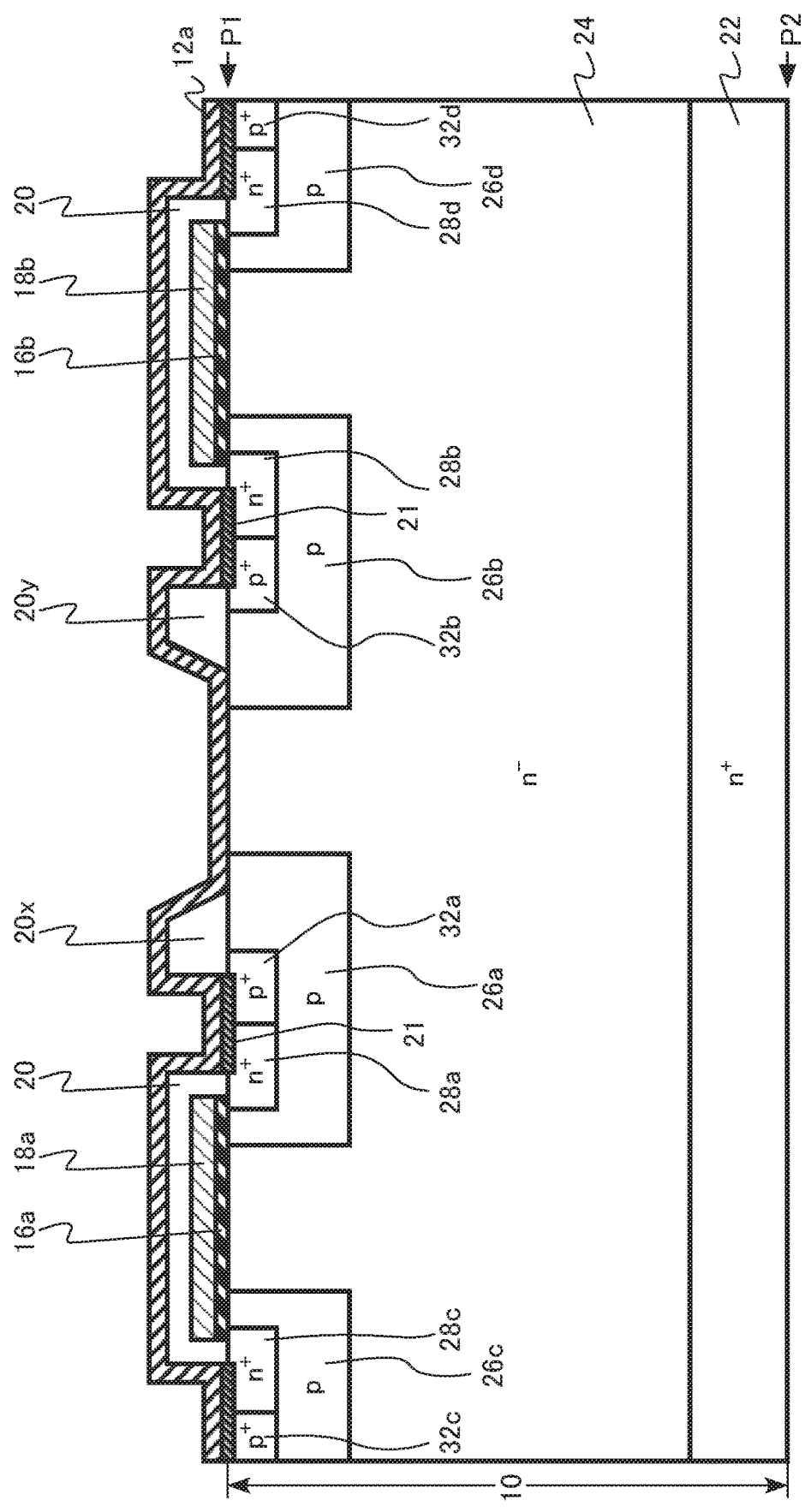
FIG. 10 is a schematic cross-sectional view in the process of manufacturing the semiconductor device according to the embodiment.

Next, the second resist mask 52 is removed. Next, a barrier metal layer 12a is formed on the drift region 24 exposed in the opening of the interlayer insulating layer 20, the silicide layer 21, and the interlayer insulating layer 20 by, for example, a sputtering method (FIG. 10).

After that, the main metal layer 12b is formed on the barrier metal layer 12a by a sputtering method.

After that, the drain electrode 14 is formed on a side of the second plane P2 of the silicon carbide layer 10 by a known process technique.

According to the above-described manufacturing method, the MOSFET 100 illustrated in FIG. 1 is manufactured.

Next, the functions and effects of the MOSFET 100 according to the embodiment will be described.

Figure 11:
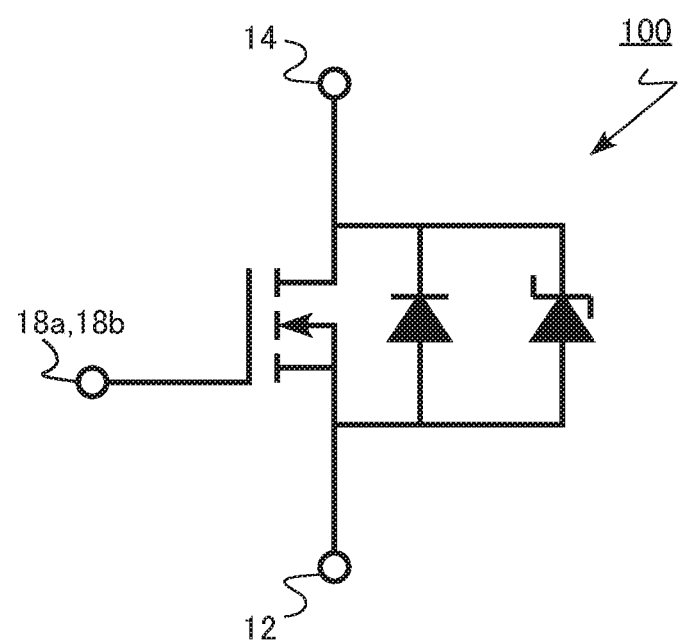
FIG. 11 is an equivalent circuit diagram of the semiconductor device according to the embodiment.

FIG. 11 is an equivalent circuit diagram of the semiconductor device according to the embodiment. Between the source electrode 12 and the drain electrode 14, a pn diode and an SBD are connected in parallel to the transistor having the first gate electrode 18a and the second gate electrode 18b as built-in diodes. The first body region 26a, the second body region 26b, the third body region 26c, and the fourth body region 26d are the anode of the pn junction diode, and the drift region 24 is the cathode of the pn junction diode. In addition, the source electrode 12 is the anode of the SBD, and the drift region 24 is the cathode of the SBD.

Hereinafter, in a MOSFET having a built-in SBD, a region in which a transistor having a gate electrode is arranged is defined as a transistor region, and a region in which an SBD is arranged is defined as a Schottky region.

For example, considered is a case where the MOSFET 100 is used as a switching element connected to an inductive load. When the MOSFET 100 is turned off, in some cases, a voltage that makes the source electrode 12 positive relative to the drain electrode 14 may be applied due to a load current caused by the inductive load. In this case, forward current flows in the built-in diode. This state s also called a reverse conduction state.

The forward voltage (Vf) at which the forward current starts to flow in the SBD is lower than the forward voltage (Vf) of the pn junction diode. Therefore, first, the forward current flows in the SBD.

The forward voltage (Vf) of the SBD is, for example, 1.0 V. The forward voltage (Vf) of the pn junction diode is, for example, 2.5 V.

The SBD performs unipolar operation. For this reason, even if the forward current flows, stacking faults do not grow in the silicon carbide layer 10 due to the recombination energy of carriers.

Figure 12:
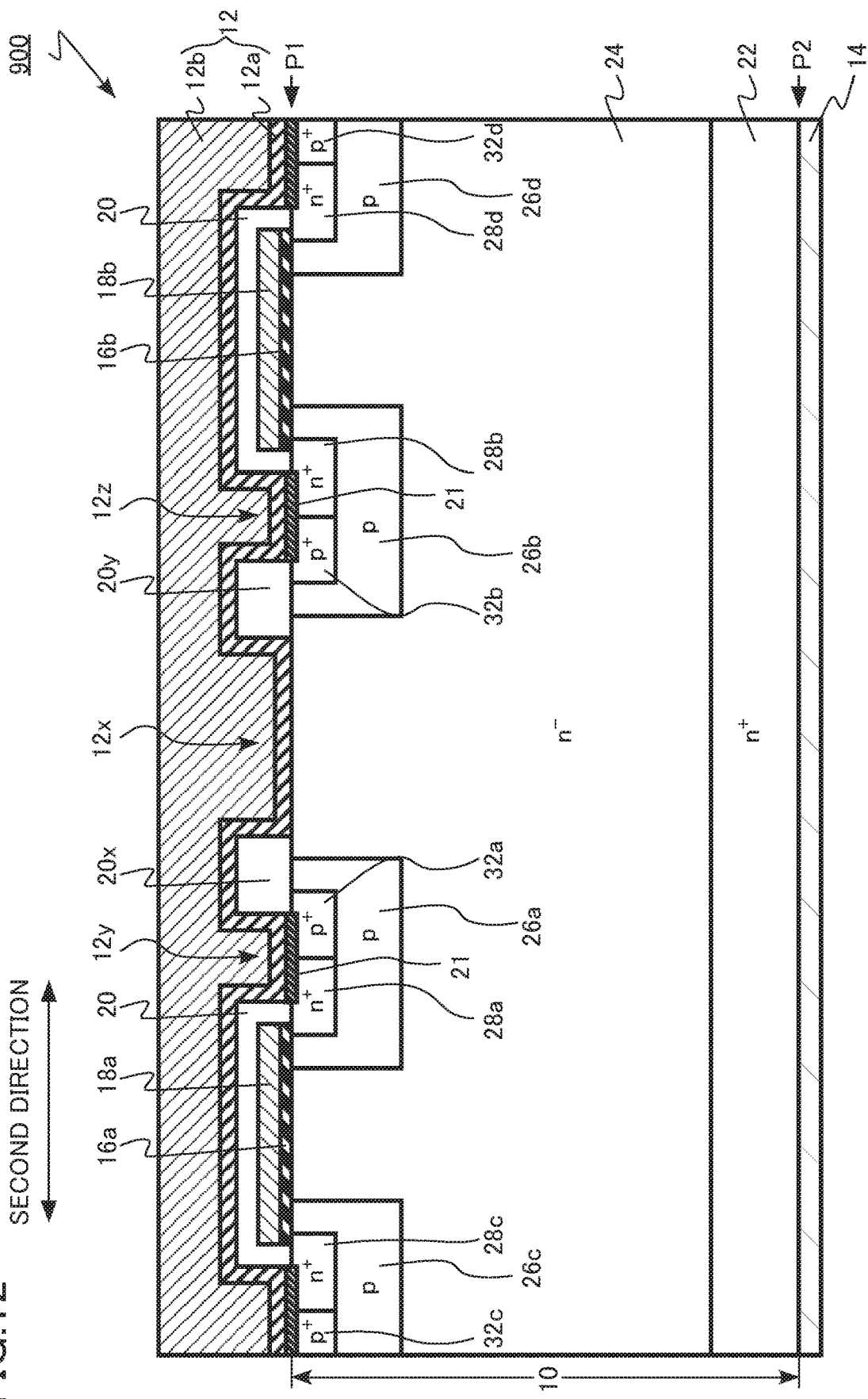
FIG. 12 is a schematic cross-sectional view of a semiconductor device according to Comparative Example.

FIG. 12 is a schematic cross-sectional view of a semiconductor device according to Comparative Example. FIG. 12 is a schematic cross-sectional view of a MOSFET 900 according to Comparative Example. The cross section corresponds to the cross section of FIG. 1.

The MOSFET 900 according to Comparative Example is different from the MOSFET 100 according to the embodiment in that the first buffer region 20x and the second buffer region 20y have a right-left symmetrical rectangular shape, and the Schottky portion 12x is not in contact with the first body region 26a and the second body region 26b.

In comparison with the case of using the pn junction diode as a built-in diode, in a case where the SBD is used as a built-in diode, the amount of heat generated locally in the diode portion becomes large. In comparison with the pn junction diode, the SBD has a forward current characteristic with a gradual slope with respect to the voltage. For this reason, in comparison with the pn junction diode, the voltage for flowing a desired current in the SBD becomes high, and thus, the amount of heat generated defined by the product of the current and the voltage is increased.

The MOSFET 100 and the MOSFET 900 have a structure in which transistor regions and Schottky regions are repeatedly arranged. In such a structure, in a case where the pn junction diode is used as a built-in diode, a forward current flows through the p-type body regions widely and uniformly distributed in the chip plane. On the other hand, in a case where the SBD is used as a built-in diode, a current concentrates only in the Schottky regions where the source electrode is in contact with the drift region. For this reason, in comparison with the pn junction diode, the amount of heat generated for flowing a desired current in the SBD is increased.

In particular, if the ratio of the transistor region to the Schottky region is increased in order to increase the ON current of the MOSFET 100, the current density in the Schottky region is increased. Therefore, the amount of heat generated in the Schottky region is further increased.

For example, when the Schottky region of the MOSFET 900 generates heat, thermal expansion of the Schottky portion 12x of the source electrode 12 occurs. As the Schottky portion 12x repeats thermal expansion, there is a concern that cracks may occur, for example, in the barrier metal layer 12a.

When a crack occurs in the barrier metal layer 12a, the metal, for example, aluminum constituting the main metal layer 12b diffuses into the drift region 24. The diffusion of aluminum, for example, causes variations in characteristics of the SBD. There is a concern that an increase in the leakage current of the SBD or a change in the forward current may occur. Therefore, there is a concern that the reliability of the MOSFET 900 may deteriorate.

In particular, in a case where the first buffer region 20x is rectangular similarly to the MOSFET 900, stress concentrates at a corner where the first buffer region 20x and the first plane P1 are in contact, and thus, the barrier metal layer 12a is likely to be cracked.

In addition, when thermal expansion of the Schottky portion 12x of the source electrode 12 occurs, the first buffer region 20x is compressed in the second direction, and thus, stress is applied to the first contact portion 12y. Due to this stress, there is a concern that film peeling between the barrier metal layer 12a of the first contact portion 12y and the silicide layer 21 may occur.

Excess carbons generated during the formation of the silicide layer 21 are contained inside and on the front surface of the silicide layer 21. Therefore, the adhesion between the silicide layer 21 and the barrier metal layer 12a is not necessarily high.

When film peeling occurs between the barrier metal layer 12a and the silicide layer 21, the contact resistance of the first contact portion 12y increases. Therefore, the on-resistance of the MOSFET 900 increases. Therefore, there is a concern that the reliability of the MOSFET 900 may deteriorate.

In particular, in a case where the first buffer region 20x is rectangular like the MOSFET 900, the amount of compression of the first buffer region 20x in the second direction is increased. For this reason, the stress applied to the first contact portion 12y is increased. Therefore, film peeling between the barrier metal layer 12a and the silicide layer 21 easily occurs.

In the MOSFET 100 according to the embodiment, the first side surface S1 of the first buffer region 20x on the Schottky portion 12x side has a tapered shape. Therefore, in a case where thermal expansion of the Schottky portion 12x occurs, the stress at the corner portion where the first buffer region 20x and the first plane P1 are in contact with each other is decreased. Therefore, cracks hardly occur in the barrier metal layer 12a.

In addition, since the first side surface S1 has a tapered shape, in a case where the thermal expansion of the Schottky portion 12x occurs, the amount of compression of the first buffer region 20x in the second direction is decreased. Therefore, film peeling between the barrier metal layer 12a and the suicide layer 21 hardly occurs.

Therefore, the characteristic fluctuation of the MOSFET 100 is suppressed, and thus, the reliability of the MOSFET 100 is improved.

Furthermore, in the MOSFET 100, the corner portion of the Schottky portion 12x on the first plane P1 side is in contact with the first body region 26a and the second body region 26b. Therefore, even if a crack occurs in the barrier metal layer 12a and the metal constituting the main metal layer 12b diffuses into the silicon carbide layer 10, the metal diffused remains in the first body region 26a and the second body region 26b which are p-type regions. Therefore, the characteristic variation of the SBD hardly occurs.

The first angle θ1 between the first side surface S1 of the first buffer region 20x on the Schottky portion 12x side and the first plane P1 is preferably 70 degrees or less, more preferably 60 degrees or less, and further more preferably 50 degrees or less. Within the above range, cracks in the barrier metal layer 12a and film peeling between the barrier metal layer 12a and the silicide layer 21 are further suppressed.

Similarly, the first angle between the first side surface of the second buffer region 20y and the first plane P1 is preferably 70 degrees or less, more preferably 60 degrees or less, and further more preferably 50 degrees or less.

The second angle θ2 of the second side surface S2 of the first buffer region 20x on the first contact portion 12y side is preferably 80 degrees or more, and more preferably 85 degrees or more. Within the above range, the area required for forming the first contact portion 12y becomes small, and thus, the chip size of the MOSFET 100 can be reduced.

Similarly, the second angle of the second side surface of the second buffer region 20y on the second contact portion 12z side is preferably 80 degrees or more, and more preferably 85 degrees or more. Within the above range, the area required for forming the second contact portion 12z becomes small, and thus, the chip size of the MOSFET 100 can be reduced.

As described above, according to the embodiment, a fluctuation in characteristics is suppressed, and thus, it is possible to realize a MOSFET with an improved reliability.

In the embodiment, a case where the 4H—SiC is used as a crystal structure of the SiC has been described as an example, but the invention may be applied to devices using SiC having other crystal structures such as 6H—SiC and 3C—SiC. In addition, a plane other than the (0001) plane may also be applied to the front surface of the silicon carbide layer 10.

In the embodiment, a case where the first conductivity type is n-type and the second conductivity type is p-type has been described as an example, but the first conductivity type may be p-type and the second conductivity type may be n-type.

In the embodiment, aluminum (Al) is exemplified as p-type impurities, but boron (B) may also be used. In addition, nitrogen (N) and phosphorus (B) are exemplified as n-type impurities, but arsenic (As), antimony (Sb), or the like may also be applied.

While certain embodiments have been described, these embodiments have been presented by way of example only, and are not intended to limit the scope of the inventions. Indeed, semiconductor devices described herein may be embodied in a variety of other forms furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a silicon carbide layer having a first plane and a second plane opposite to the first plane;
   a first silicon carbide region of a first conductivity type provided in the silicon carbide layer;
   a second silicon carbide region of a second conductivity type provided between the first silicon carbide region and the first plane;
   a third silicon carbide region of the second conductivity type provided between the first silicon carbide region and the first plane;
   a fourth silicon carbide region of the first conductivity type provided between the second silicon carbide region and the first plane;
   a first gate electrode provided on a side of the first plane of the silicon carbide layer;
   a second gate electrode provided on a side of the first plane of the silicon carbide layer;
   a first gate insulating layer provided between the first gate electrode and the second silicon carbide region;
   a second gate insulating layer provided between the second gate electrode and the third silicon carbide region;
   a silicide layer provided on the fourth silicon carbide region;
   a first electrode provided on a side of the first plane of the silicon carbide layer, the first electrode having a first portion located between the first gate electrode and the second gate electrode and a second portion located between the first portion and the first gate electrode, the first portion being in contact with the first silicon carbide region between the second silicon carbide region and the third silicon carbide region, and the second portion being in contact with the silicide layer;
   a second electrode provided on a side of the second plane of the silicon carbide layer; and
   an insulating layer provided between the first portion and the second portion, having a first side surface on a side of the first portion and a second side surface on a side of the second portion, a first angle between the first side surface and the first plane being smaller than a second angle between the second side surface and the first plane.

2. The semiconductor device according to claim 1, wherein the first portion is in contact with the second silicon carbide region.

3. The semiconductor device according to claim 1, wherein the first angle is 70 degrees or less.

4. The semiconductor device according to claim 1, wherein the insulating layer contains a silicon oxide.

5. The semiconductor device according to claim 1, wheren the first electrode has a first layer and a second layer, the first layer is located between the silicon carbide layer and the second layer, and the first layer contains titanium and the second layer contains aluminum.

6. The semiconductor device according to claim 1, wherein junction between the first portion and the first silicon carbide region is Schottky junction.

7. The semiconductor device according to claim 1, wherein the silicide layer is nickel silicide, titanium silicide, molybdenum silicide, or tungsten silicide.

8. The semiconductor device according to claim 1, wherein the second angle is 80 degrees or more.

9. The semiconductor device according to claim 3, wherein the second angle is 80 degrees or more.

10. The semiconductor device according to claim 1, wherein the first conductivity type is n-type, and the second conductivity type is p-type.

* * * * *